(12) United States Patent
Kiyoshi et al.

(10) Patent No.: US 10,191,602 B2
(45) Date of Patent: Jan. 29, 2019

(54) CAPACITIVE INPUT DEVICE HAVING A CURVED SURFACE

(71) Applicant: ALPS ELECTRIC CO., LTD., Tokyo (JP)

(72) Inventors: Tsutomu Kiyoshi, Miyagi-ken (JP); Mitsuo Oizumi, Miyagi-ken (JP); Hidekazu Takahashi, Miyagi-ken (JP)

(73) Assignee: ALPS ELECTRIC CO., LTD., Tokyo (JP)

(*) Notice: Subject to any disclaimer, the term of this patent is extended or adjusted under 35 U.S.C. 154(b) by 34 days.

(21) Appl. No.: 15/042,435

(22) Filed: Feb. 12, 2016

(65) Prior Publication Data
US 2016/0162077 A1  Jun. 9, 2016

Related U.S. Application Data

(63) Continuation of application No. PCT/JP2014/069833, filed on Jul. 28, 2014.

(30) Foreign Application Priority Data

Aug. 23, 2013  (JP) .................................. 2013-173530

(51) Int. Cl.
   *G06F 3/044* (2006.01)
   *H03K 17/96* (2006.01)
   *C09D 5/24* (2006.01)
   *C09D 181/08* (2006.01)
   *G06F 3/041* (2006.01)

(52) U.S. Cl.
   CPC .............. *G06F 3/044* (2013.01); *C09D 5/24* (2013.01); *C09D 181/08* (2013.01);
   (Continued)

(58) Field of Classification Search
   CPC ....................................................... G06F 3/044
   (Continued)

(56) References Cited

U.S. PATENT DOCUMENTS 7,534,500 B2    5/2009  Kobayashi et al.
2004/0265602 A1  12/2004  Kobayashi et al.
(Continued)

FOREIGN PATENT DOCUMENTS

CN       102365698 A     2/2012
JP       2003-115221 A   4/2003
(Continued)

OTHER PUBLICATIONS

International Search Report for corresponding International Patent Application No. PCT/JP2014/069833, dated Sep. 30, 2014, 3 pages.

*Primary Examiner* — Long D Pham
(74) *Attorney, Agent, or Firm* — Brinks Gilson & Lione

(57) ABSTRACT

A capacitive input device having a curved surface shape includes: an external body molded with a synthetic resin, the external body having an external curved surface facing a user; a film base, which is integrally provided so as to conform to the internal curved surface of the external body; a conductive layer made of conductive macromolecules, the conductive layer being formed on an opposite surface of the film base, the opposite surface being opposite to a bonded surface, of the film base, that is bonded to the external body; and wiring layers that are electrically connected to the conductive layer.

3 Claims, 9 Drawing Sheets

(52) U.S. Cl.
CPC ......... *G06F 3/0416* (2013.01); *H03K 17/962* (2013.01); *G06F 2203/04103* (2013.01); *H01H 2215/006* (2013.01); *H01H 2239/006* (2013.01); *H03K 2217/960755* (2013.01)

(58) Field of Classification Search
USPC ........................................................ 345/174
See application file for complete search history.

(56) References Cited

U.S. PATENT DOCUMENTS

| | | | |
|---|---|---|---|
| 2010/0080967 A1* | 4/2010 | Hu ........................ | G06F 3/045 428/203 |
| 2012/0019476 A1 | 1/2012 | Kim et al. | |
| 2012/0032916 A1* | 2/2012 | Enoki .................... | G06F 3/044 345/174 |
| 2012/0244772 A1 | 9/2012 | Elder | |
| 2013/0194181 A1* | 8/2013 | Nakajima .............. | G06F 3/033 345/157 |

FOREIGN PATENT DOCUMENTS

| | | |
|---|---|---|
| JP | 2010-244772 A | 10/2010 |
| JP | 2010244772 A | 10/2010 |
| JP | 2010267607 A | 11/2010 |
| JP | 2012-027894 A | 2/2012 |
| JP | 2012-133428 A | 7/2012 |
| KR | 20120022733 A | 3/2012 |
| RU | 2011140014 A | 4/2013 |
| TW | 201037587 A | 10/2010 |

\* cited by examiner

CAPACITIVE INPUT DEVICE HAVING A CURVED SURFACE

CLAIM OF PRIORITY

This application is a Continuation of International Application No. PCT/JP2014/069833 filed on Jul. 28, 2014, which claims benefit of priority to Japanese Patent Application No. 2013-173530 filed on Aug. 23, 2013. The entire contents of each application noted above are hereby incorporated by reference in their entirety.

BACKGROUND

1. Field of the Disclosure

The present disclosure relates to a capacitive input device used in various electronic units, and more particularly to a capacitive input device having a curved surface shape.

2. Description of the Related Art

Recently, capacitive input devices have come into widespread use that detect a slight change in capacitance at a portion that a user has lightly touched with a fingertip, convert a position and a direction of motion to electric signals, and output the converted signals. Capacitive input devices of this type are advantageous in that switches and other mechanical parts can be eliminated and these capacitive input devices are thereby superior in design but are disadvantageous in that vacuum deposition is needed because an indium tin oxide (ITO) film is used as a transparent electrode for use in detection. Therefore, the shapes of these capacitive input devices are limited essentially to a simple two-dimensional shape (planar shape) from an industrial viewpoint, placing a limit on portions of products to which capacitive input devices are applied.

In view of the above disadvantages, Japanese Unexamined Patent Application Publication No. 2010-267607 proposes capacitive sensors (capacitive input devices) 900 that can be attached to a portion with a curved surface. As conventional examples, FIGS. 9A and 9B illustrate the capacitive sensors 900 proposed in Japanese Unexamined Patent Application Publication No. 2010-267607; FIG. 9A schematically illustrates a capacitive sensor 900A in embodiment A and FIG. 9B schematically illustrates a capacitive sensor 900B in embodiment B.

The capacitive sensor 900A in FIG. 9A and capacitive sensor 900B in FIG. 9B each include a film base 901, which is three-dimensionally formed, a decorative layer 910, which is integrally formed on the film base 901, a conductive circuit pattern layer 920 that detects a change in capacitance, a supporting body 940 that supports the film base 901, and a protective layer 930A that suppresses conductive ink in the circuit pattern layer 920 from exuding. In addition, the capacitive sensor 900A in FIG. 9A includes a protective layer 935 that prevents the surface of the decorative layer 910 from being scratched or worn, and the capacitive sensor 900B in FIG. 9B includes an insulative resist layer 925. When a finger EN of the user touches a surface in a three-dimensional shape, the capacitive sensor 900 (900A or 900B) detects, in the circuit pattern layer 920, a slight change in capacitance at the portion that the tip of the finger FN has touched.

With the capacitive sensors 900 (900A and 900B), the circuit pattern layer 920 includes a first circuit pattern layer 923 and a second circuit pattern layer 924 to improve detection precision of the capacitive sensors 900 (900A and 900B) and diversify their structures. Furthermore, the circuit pattern layer 920 is formed by using a conductive ink including a silver paste, a carbon ink, a conductive polymer (Seplegyda from Shin-Etsu Polymer Co., Ltd.), and the like without using an indium tin oxide (ITO) film, so the circuit pattern layer 920 can be formed on the film base 901, which is three-dimensionally formed, and the supporting body 940.

However, the property of the conductive polymer (conductive macromolecules) used in the conventional examples is that when the layer of the conductive polymer absorbs moisture, the resistance of the layer is increased. Therefore, there has been a risk that if absorbed moisture is not removed, detection precision is lowered. Particularly, in the structures in the conventional examples, the second circuit pattern layer 924 in the capacitive sensor 900A and the circuit pattern layer 920 (including the first circuit pattern layer 923 and second circuit pattern layer 924) in the capacitive sensor 900B are structured so as to be interposed between the film base 901 and the supporting body 940. This has been problematic in that once moisture penetrates into the film base 901 or supporting body 940 and is absorbed by the circuit pattern layer 920 (including the first circuit pattern layer 923 and second circuit pattern layer 924), the moisture is not easily removed. Therefore, there has been a risk that after the capacitive sensors 900 in the conventional examples have been exposed to a humid environment, detection precision is lowered and the capacitive sensors 900 does not easily recover from the lowered detection precision.

SUMMARY

A capacitive input device includes: an external body molded with a synthetic resin, the external body having an external curved surface facing a user; a film base, which is integrally provided so as to conform to the internal curved surface of the external body; a conductive layer made of conductive macromolecules, the conductive layer being formed on an opposite surface of the film base, the opposite surface being opposite to a surface of the film base on the external body side; and wiring layers that are electrically connected to the conductive layer.

Accordingly, since the capacitive input device in the present invention is structured so that the conductive layer is not interposed between the external body and the film base, moisture in the conductive layer is easily released from the surface of the conductive layer formed on the film base surface opposite to the film base surface on the external body side without being impeded by the film base and external body. Therefore, even if the capacitive input device has been exposed to a humid environment, the resistance of the conductive easily returns to its original value and the capacitive input device can quickly recover from lowered detection precision.

DESCRIPTION OF THE EXEMPLARY EMBODIMENTS

An embodiment of the present invention will be described below with reference to the drawings.

First Embodiment

Figure 1:
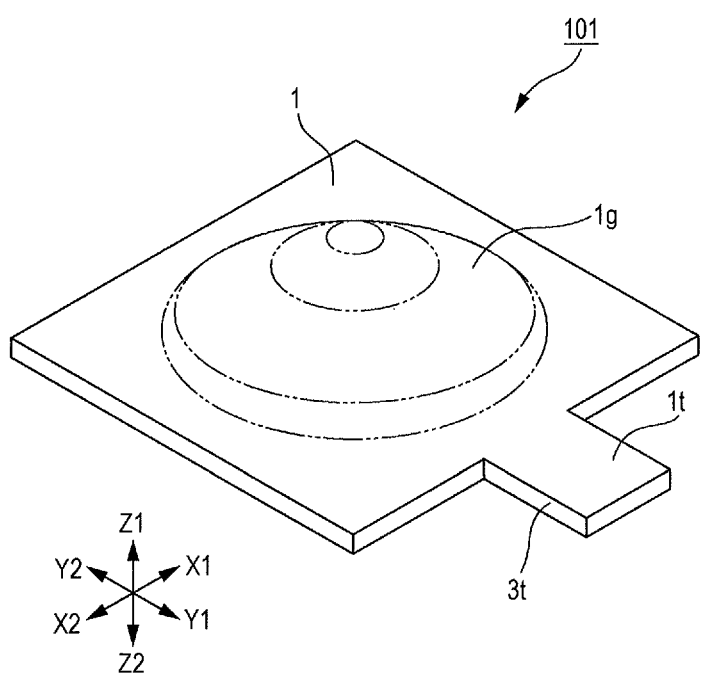
FIG. 1 is a perspective view illustrating a capacitive input device having a curved surface shape according to a first embodiment of the present invention.
Figure 2:
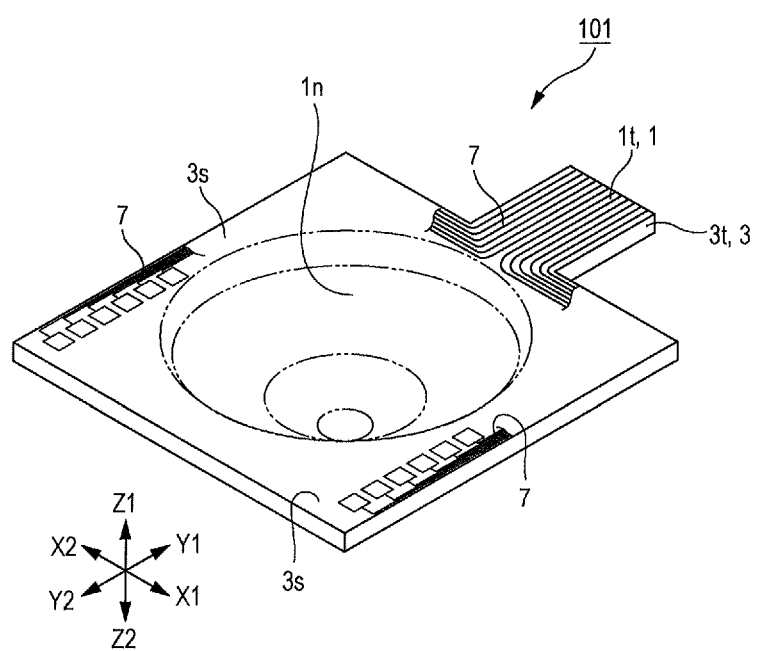
FIG. 2 is a perspective view illustrating the capacitive input device having a curved surface shape according to the first embodiment of the present invention, when viewed from the same side as Z2 in FIG. 1.
Figure 3:
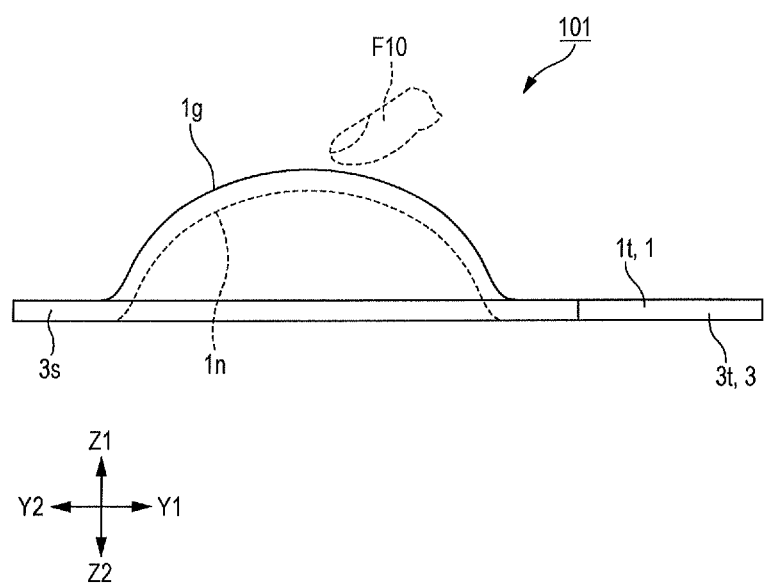
FIG. 3 is a side view illustrating the capacitive input device having a curved surface shape according to the first embodiment of the present invention, when viewed from the same side as X2 in FIG. 1.
Figure 4:
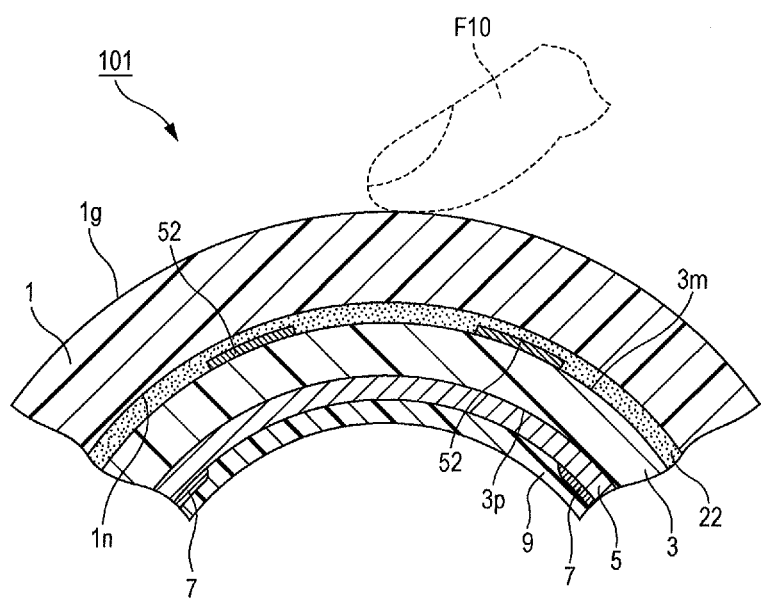
FIG. 4 is a drawing illustrating the capacitive input device having a curved surface shape according to the first embodiment of the present invention, indicating a cross-sectional view of the structure of a portion having the curved surface shape.

FIG. 1 is a perspective view illustrating a capacitive input device 101 having a curved surface shape according to a first embodiment of the present invention. FIG. 2 is a perspective view illustrating the capacitive input device 101 having a curved surface shape according to the first embodiment of the present invention, when viewed from the same side as Z2 in FIG. 1. FIG. 3 is a side view illustrating the capacitive input device 101 having a curved surface shape according to the first embodiment of the present invention, when viewed from the same side as X2 in FIG. 1. FIG. 4 is a drawing illustrating the capacitive input device 101 having a curved surface shape according to the first embodiment of the present invention, indicating a cross-sectional view of the structure of a portion having the curved surface shape. The size of the specific body part F10 in FIGS. 3 and 4 and the sizes of all layers in FIG. 4 are illustrated for conceptual purposes only, and do not represent actual sizes.

The capacitive input device 101 having a curved surface shape in the first embodiment of the present invention uses a detection method called a capacitance-type detection method. When the user brings his or her specific body part F10 (fingertip in FIG. 3), which will be referred to below as the fingertip F10, into contact with or close to the surface of the capacitive input device 101 as illustrated in FIG. 3, the capacitive input device 101 detects the coordinate position of the fingertip F10 on the surface from a change in capacitance value, enabling the user to perform an input operation allowed at the coordinate position of the fingertip F10.

As illustrated in FIGS. 1 to 4, the capacitive input device 101 includes an external body 1 having an external curved surface 1g, which faces the user, a film base 3 formed integrally so as to conform an internal curved surface 1n, which is an internal surface of the external body 1, a conductive layer 5 formed on an opposite surface 3p of the film base 3, and wiring layers 7 that are electrically connected to the conductive layer 5. Although not illustrated, the capacitive input device 101 further includes a detecting unit that receives signals indicating a change in capacitance value from the conductive layer 5 through the wiring layers 7 and a control unit that outputs a command signal in response to a signal from the detecting unit. The detection unit and control unit have ordinary functions of a capacitive sensor and do not impose any restrictions on the present invention, so their detailed descriptions will be omitted.

The external body 1 of the capacitive input device 101 is formed stereoscopically (three-dimensionally) by injection molding using polyethylene terephthalate (PET), polycarbonate (PC), or another transparent synthetic resin. The capacitive input device 101 in the first embodiment of the present invention has a rectangular outside shape, at the center of which the external curved surface 1g facing the user is formed so as to have a convex dome shape (curved surface shape), as illustrated in FIGS. 1 to 3. The capacitive input device 101 also has a pull-out part 1t extending from one outer edge of the rectangle in one direction.

The film base 3 of the capacitive input device 101 uses PET, polyethylene naphthalate (PEN), or another transparent synthetic resin. As illustrated in FIG. 4, a transparent adhesive layer 22 is provided on the same side as a bonding surface 3m bonded to the external body 1, and the film base 3 is integrally formed so as to conform to a concave internal curved surface 1n, which is the internal surface of the external body 1. A terminal part 3t is integrally formed so as to conform to the internal surface of the pull-out part it of the external body 1. The terminal part 3t provides an electrical connection to the detecting unit described above.

As a manufacturing method for this integrated formation, a method is used in which, during injection molding of the external body 1, the film base 3 is interposed in a mold and insert molding is then performed. Thus, the film base 3 is stereoscopically (three-dimensionally) formed and is integrally formed so as to conform the internal curved surface in of the external body 1. Another manufacturing method can also be used in which a film base is stereoscopically (three-dimensionally) formed in advance by performing press molding by use of a mold, after which the film base is laminated on an external body, which has been stereoscopically (three-dimensionally) formed, and is then bonded to the external body. In this method, the film base can be easily manufactured. Alternatively, a film base can also be easily manufactured in a method in which the stereoscopically (three-dimensionally) formed film base described above is interposed in a mold and insert molding is then performed to form the film base integrally with an external body.

To improve the nature of the design of a product, decorative layers 52 are provided on the bonding surface 3m of the film base 3 as illustrated in FIG. 4, the bonding surface 3m being bonded to the external body 1. The decorative layer 52 can be easily manufactured by directly printing text, a figure, a symbol, or a pattern formed by combining them on the film base 3 by a screen printing method, a tampo printing method, or the like. In addition to improvement of the nature of the design, the decorative layer 52 can be used for other various purposes; for example, the decorative layer 52 can be used as a blinding layer that makes the wiring layers 7 invisible to the user and as a light shielding layer that shields light emitted from a light source. To simplify explanation, patterns on the decorative layers 52 are intentionally omitted in FIGS. 1 to 3.

As illustrated in FIG. 4, the conductive layer 5 of the capacitive input device 101 is formed on the opposite surface 3p of the film base 3, the opposite surface 3p being opposite to the bonding surface 3m. The conductive layer 5 is preferably a mixture of poly (3,4-ethylenedioxythiophene) (PEDOT) and polystyrene sulfonate (PSS), which are conductive macromolecules (the mixture will be referred to below as the PEDOT:PSS). The PEDOT:PSS is transparent. In addition, it is a material that can assure sufficient transparency and can offer desired conductivity. The PEDOT:PSS is also superior in stability in a high-temperature environment and has a higher resistance to bending machining than indium tin oxide (ITO). In addition, since the PEDOT:PSS is water dispersible, it can be easily coated and a film can be easily formed by drying the coated PEDOT:PSS to cure it. Therefore, the conductive layer having a curved surface can be easily manufactured. By drying the coated PEDOT:PSS to cure it, a film can be easily formed. The conductive layer 5 can be easily coated to the film base 3 by a screen printing method or the like.

Although not illustrated in detail, the conductive layer 5 has an electrode pattern in which a plurality of linear patterns are aligned in parallel, achieving an electrode function that detects a change in capacitance value between the electrode pattern and the fingertip F10 of the user. In the conventional examples, to implement a coordinate detecting unit that detects a change in capacitance value, electrodes in two layers, the first circuit pattern layer 923 in the X direction and the second circuit pattern layer 924 in the Y direction, have been used. In the first embodiment of the present invention, however, the conductive layer 5 is formed as a single layer and a single-layer electrode is used to detect a change in capacitance value. In the first embodiment of the present invention, therefore, the conductive layer 5 is thin; its thickness is about 0.1 μm to several micrometers. By comparison, in the conventional examples, it is disclosed that the thickness of the electrode of the conductive circuit pattern layer 920 is about 1 to 15 μm or 10 to 15 μm.

As described above, the external body 1, film base 3, and conductive layer 5 are preferably transparent, so the whole of the operation surface can be made transparent. This enables the capacitive input device 101 to be suitably applied to a product that needs to be transparent. If the decorative layers 52 described above are added to the capacitive input device 101, it is also possible to increase the decorativeness of a product to which the capacitive input device 101 is applied.

Each wiring layer 7 of the capacitive input device 101 is formed so as to overlap part of the conductive layer 5 as illustrated in FIG. 4 and is electrically connected to the conductive layer 5. As illustrated in FIG. 2, the wiring layer 7 is laid from one outer edge 3s of the rectangular shape to the terminal part 3t. The wiring layer 7 at the terminal part 3t can be easily connected through a connector or the like to a wire connected to the detecting unit.

The wiring layer 7 can be easily manufactured by screen-printing a conductive complex material including a silver paste, a carbon ink, and the like on the film base 3 on which the conductive layer 5 is formed on the opposite surface 3p and drying the screen-printed conductive complex material to cure it. Since the wiring layer 7 is formed by using a conductive complex material including a silver paste, a carbon ink, and the like, the wiring layer 7 has a higher resistance to bending machining as with the conductive layer 5 than in a case in which indium tin oxide (ITO) is used.

A protective layer 9 in the capacitive input device 101 is preferably formed so as to cover the conductive layer 5 as illustrated in FIG. 4 by using an insulative synthetic resin. In the first embodiment of the present invention, the protective layer 9 also covers the wiring layers 7. Therefore, the conductive layer 5 is protected from, for example, scratches due to a physical action caused during manufacturing and damage in an environment. This can increase the weather resistance of the capacitive input device 101 having a curved surface shape. It will be apparent that the protective layer 9 is transparent. To prevent the protective layer 9 from impeding the release of moisture absorbed by the conductive layer 5, the protective layer 9 is formed so as to be thinner than the film base 3.

The protective layer 9 can be easily stacked so as to cover the conductive layer 5 by screen-printing an insulative ink or the like on the film base 3 on which the conductive layer 5 is formed on the opposite surface 3p and drying the insulative ink to cure it.

The capacitive input device 101 formed as described above has a layer structure in which the conductive layer 5 is not interposed between the film base 3 and the external body 1 (equivalent to the supporting body 940 in a conventional examples). By comparison, in the layer structure of the capacitive sensor 900A in a conventional example, the second circuit pattern layer 924 is interposed between the film base 901 and the supporting body 940, and in the layer structure of the capacitive sensor 900B in a conventional example, the circuit pattern layer 920 (including the first circuit pattern layer 923 and second circuit pattern layer 924) is interposed therebetween. With the capacitive input device 101, therefore, moisture in the conductive layer 5 is easily released from the opposite surface 3p of the film base 3, the opposite surface 3p being opposite to the bonding surface 3m bonded to the external body 1. Even if, therefore, the conductive layer 5 absorbs moisture that has passed through the external body 1 in, for example, a high-temperature high-humidity environment and the resistance value of the conductive layer 5 is increased, the resistance value easily returns to its original value when the environment returns to a normal-temperature normal-humidity environment. Therefore, the capacitive input device 101 can quickly recover from lowered detection precision. Since the conductive layer 5 and wiring layers 7 are disposed on the same side as the internal curved surface 1n of the external body 1, ultraviolet rays incident from the external curved surface 1g are absorbed by the external body 1 and film base 3. Therefore, it is possible to prevent the conductive layer 5 and wiring layers 7 from being exposed to ultraviolet rays. This can increase the weather resistance of the capacitive input device 101 having a curved surface shape.

The thickness of the conductive layer 5 in the first embodiment of the present invention is about 0.1 μm to several micrometers, about one-tenth of the thickness in the conventional examples. Therefore, the conductive layer 5 is likely to be affected by humidity according to a ratio by which the thickness of the conductive layer 5 is reduced when compared with the conventional examples. Therefore, the capacitive input device 101 in the first embodiment of the present invention exhibits more outstanding effects.

Effects provided by the capacitive input device 101, having a curved surface shape, structured as described above in the first embodiment of the present invention will be described below with reference to drawings at appropriate points.

Figure 5A:
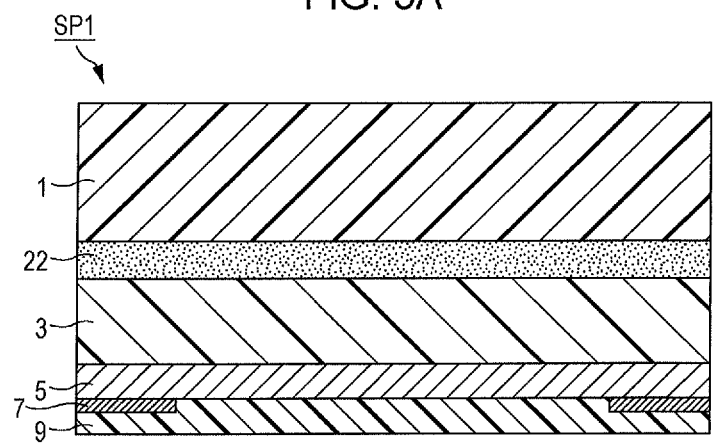
FIGS. 5A and 5B illustrate effects provided by the capacitive input device having a curved surface shape according to the first embodiment, FIG. 5A illustrating the layer structure of a sample piece, in this proposal, that was used in moisture resistance test, FIG. 5B illustrating the layer structure of a sample piece used for comparison.
Figure 5B:
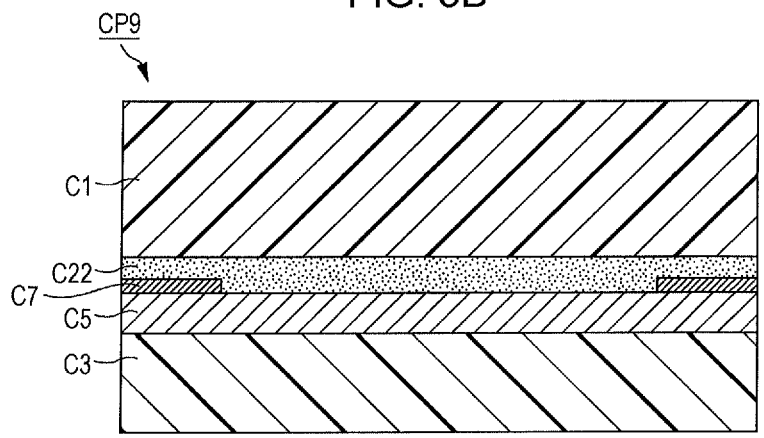
Figure 6:
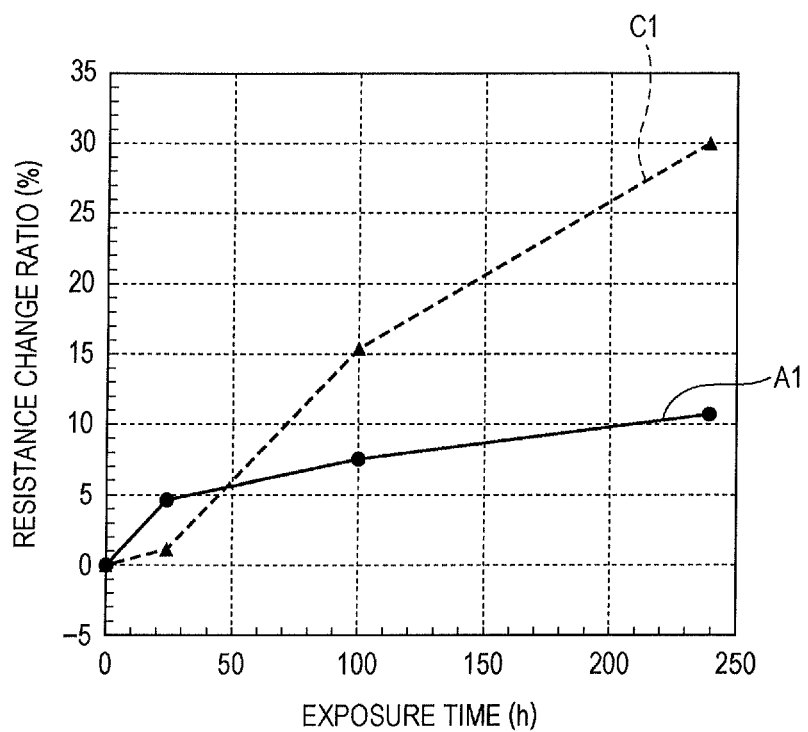
FIG. 6 illustrates effects provided by the capacitive input device having a curved surface shape according to the first embodiment, indicating a graph of moisture resistance test results.

FIGS. 5A and 5B illustrate effects provided by the capacitive input device 101 having a curved surface shape according to the first embodiment; FIG. 5A illustrates the layer structure of a sample piece SP1, in this proposal, that was used in moisture resistance test, and FIG. 5B illustrates the layer structure of a sample piece CP9 used for comparison. The sample piece SP1 in this proposal has a layer structure in which the external body 1, adhesive layer 22, film base 3, conductive layer 5, wiring layers 7, and protective layer 9 are stacked in that order. The sample piece CP9 has a layer structure in which an external body C1, an adhesive layer C22, wiring layers C7, a conductive layer C5, and a film base C3 are stacked in that order. In the layer structure of the sample piece CP9 used for comparison, the conductive layer C5 is interposed between the external body C1 and the film base C3. In the layer structure of the sample piece SP1 in this proposal, however, the conductive layer 5 is not interposed between the external body 1 and the film base 3. FIG. 6 illustrates effects provided by the capacitive input device 101 having a curved surface shape according to the first embodiment, indicating a graph of results in moisture resistance test performed by using the sample pieces illustrated in FIGS. 5A and 5B. The horizontal axis indicates accumulated time (in hours) of exposure to a high-temperature high-humidity environment, and the vertical axis indicates changes in resistance values (in percent) obtained by measuring an initial resistance value and resistance values after exposure to the high-temperature high-humidity environment for a certain time. In FIG. 6, A1 indicates results obtained from the sample piece SP1 in this proposal and C1 indicates results obtained from the sample piece CP9 used for comparison. In moisture resistance test in the high-temperature high-humidity environment, the sample pieces were exposed to an environment at a temperature of 60° C. and a humidity of 95% for a desired time, after which the environment was returned to a normal-temperature normal-humidity environment and the resistance values of the samples were measured two hours later. This cycle was repeated.

With the capacitive input device 101 having a curved surface shape according to the first embodiment of the present invention, the conductive layer 5 made of conductive macromolecules is formed on the film base 3, which is formed integrally with the external body 1 having a curved surface. Unlike the layer structure in the conventional examples, therefore, moisture in the conductive layer 5 is easily released from the opposite surface 3p of the film base 3, the opposite surface 3p being opposite to the bonding surface 3m bonded to the external body 1. Even if, therefore, the conductive layer 5 absorbs moisture that has passed through the external body 1 in, for example, a high-temperature high-humidity environment and the resistance value of the conductive layer 5 is increased as illustrated in FIG. 6, the resistance value is not increased when the environment returns to a normal-temperature normal-humidity environment (as indicated by A1 in FIG. 6), when compared with results in another layer structure (as indicated by C1 in FIG. 6). This may be because most of the moisture absorbed by the conductive layer 5 in the high-temperature high-humidity environment was released in two hours after the environment had been returned to the normal-temperature normal-humidity environment, and an increase in the resistance change ratio was thereby suppressed. As a result, the capacitive input device 101 can quickly recover from lowered detection precision, making it possible to prevent a reduction in detection precision.

Since the conductive layer 5 and wiring layers 7 are disposed on the same side as the internal curved surface 1n of the external body 1, ultraviolet rays incident from the external curved surface 1g are absorbed by the external body 1 and film base 3. Therefore, it is possible to prevent the conductive layer 5 and wiring layers 7 from being exposed to ultraviolet rays. This can increase the weather resistance of the capacitive input device 101 having a curved surface shape.

Since the conductive macromolecule is the PEDOT:PSS, it is possible to assure sufficient transparency and to obtain desired conductivity. The conductive macromolecule is also superior in stability in a high-temperature environment and in resistance to bending machining. In addition, since the conductive macromolecule is water dispersible, it can be easily coated and a film can be easily formed. Therefore, the capacitive input device 101 having a curved surface shape can be easily manufactured.

The external body 1, film base 3, and conductive layer 5 are preferably transparent, so the whole of the operation surface can be made transparent. This enables the capacitive input device 101 to be suitably applied to a product that needs to be transparent. If the decorative layer 52 is added to the capacitive input device 101, it is also possible to increase the decorativeness of a product to which the capacitive input device 101 is applied.

The protective layer 9 is preferably stacked so as to cover the conductive layer 5, so the conductive layer 5 is protected from, for example, scratches due to a physical action caused during manufacturing and damage in an environment. This can increase the weather resistance of the capacitive input device 101 having a curved surface shape.

The present invention is not limited to the embodiment described above. For example, the present invention can also be practiced by making modifications as described below. These modifications are also included in the technical range of the present invention.

Figure 7A:
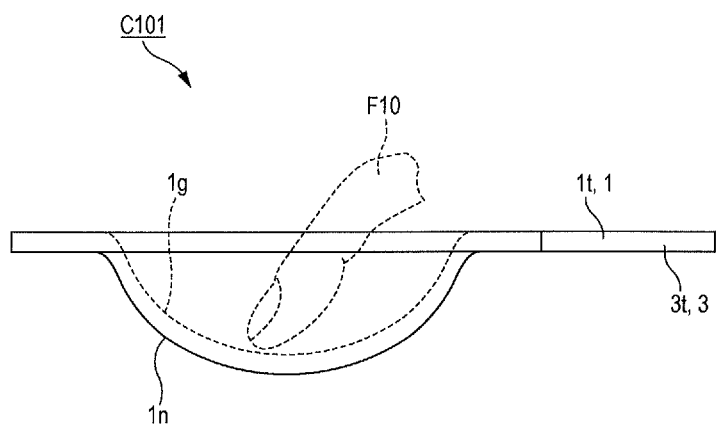
FIGS. 7A and 7B illustrate modifications of the capacitive input device having a curved surface shape according to the first embodiment, FIG. 7A being a cross-sectional view of a structure in a first modification compared with FIG. 4, FIG. 7B being a cross-sectional view of a structure in a second modification compared with FIG. 4.
Figure 7B:
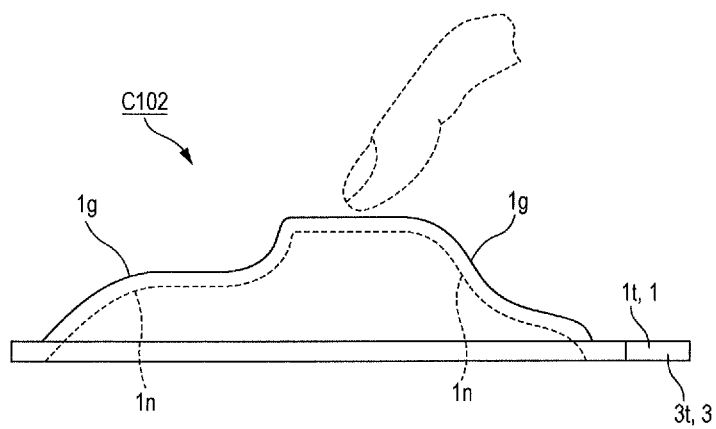
Figure 8A:
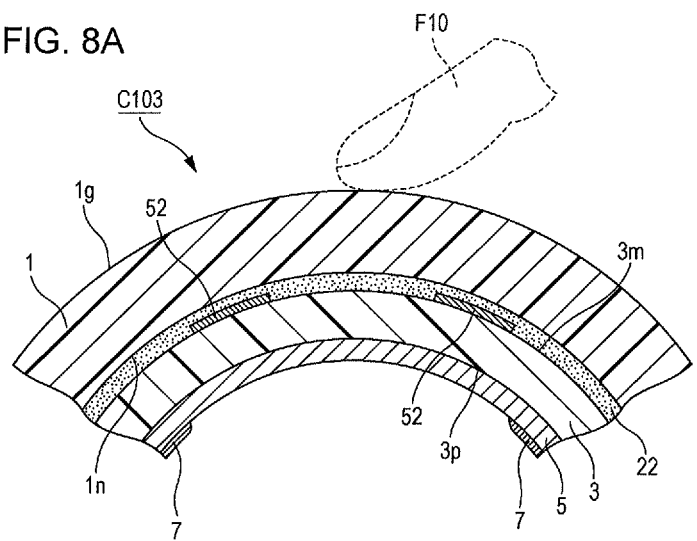
FIGS. 8A and 8B also illustrate modifications of the capacitive input device having a curved surface shape according to the first embodiment, FIG. 8A being a cross-sectional view of a structure in a third modification compared with FIG. 3, FIG. 8B being a cross-sectional view of a structure in a fourth modification compared with FIG. 3.
Figure 8B:
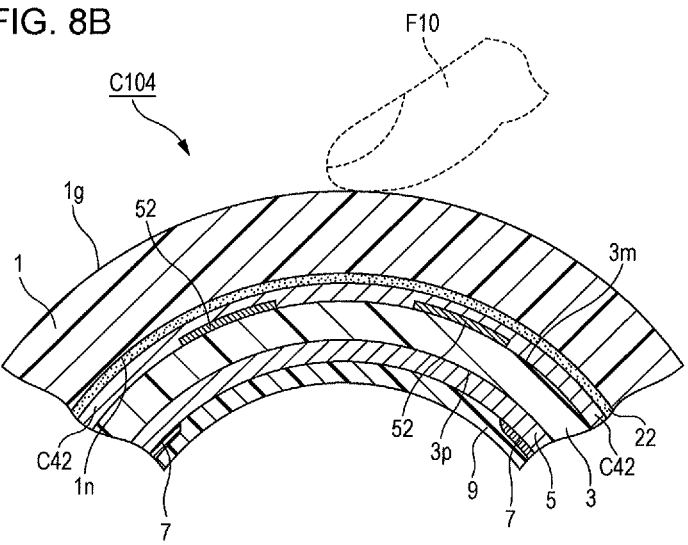
Figure 9A:
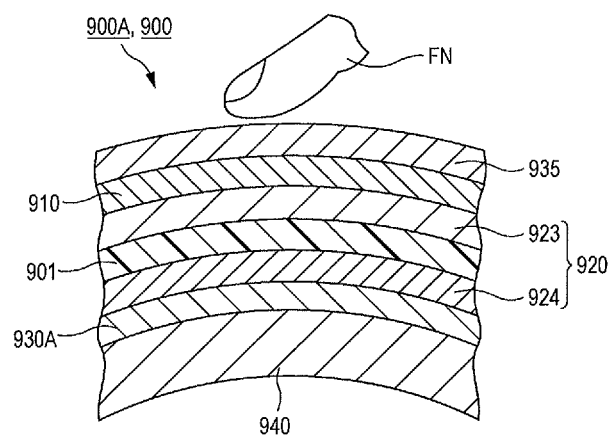
FIGS. 9A and 9B illustrate capacitive sensors 900 in conventional examples, FIG. 9A schematically illustrating a capacitive sensor in embodiment A, FIG. 9B schematically illustrating a capacitive sensor in embodiment B.
Figure 9B:
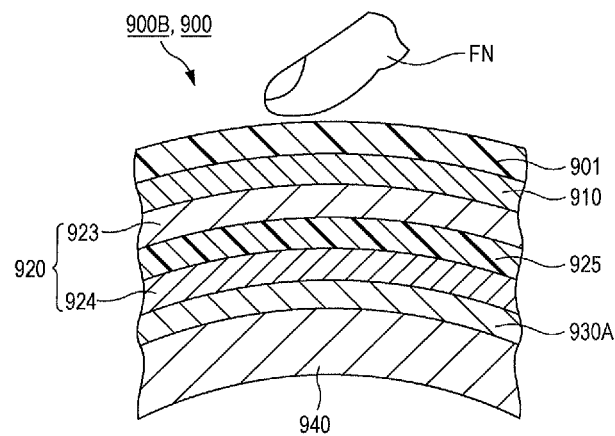

FIGS. 7A and 7B illustrate modifications of the capacitive input device 101 having a curved surface shape according to the first modification; FIG. 7A is a cross-sectional view of the structure of a capacitive input device C101 in a first modification compared with FIG. 4, and FIG. 7B is a cross-sectional view of the structure of a capacitive input device C102 in a second modification compared with FIG. 4. FIGS. 8A and 8B also illustrate modifications of the capacitive input device 101 having a curved surface shape according to the first embodiment; FIG. 8A is a cross-sectional view of the structure of a capacitive input device C103 in a third modification compared with FIG. 3, and FIG. 8B is a cross-sectional view of the structure of a capacitive input device C104 in a fourth modification compared with FIG. 3.

First Modification

Although, in the first embodiment, the external curved surface 1g facing the user has been formed so as to have a convex dome shape, the external curved surface 1g facing the user may be formed so as to have a concave bowl shape as illustrated in FIG. 7A.

Second Modification

Although, in the first embodiment, the external curved surface 1g facing the user has been formed so as to have a simple convex dome shape, the external curved surface 1g is not limited to this shape. For example, the external curved surface 1g facing the user may have a shape in which different convex shapes are combined, as illustrated in FIG. 7B.

Third Modification

Although, in the first embodiment, the protective layer 9 has been preferably formed so as to cover the conductive layer 5, the protective layer 9 may be eliminated as illustrated in FIG. 8A.

Fourth Modification

An intermediate layer C42 may be preferably added to the structure in the first embodiment described above so as to be placed between the external body 1 and the decorative layers 52 as illustrated in FIG. 8B. Therefore, it is possible to protect the decorative layers 52 from a synthetic resin, which flows at high temperature and forms the external body 1, during injection molding.

Fifth Modification

Although, in the first embodiment, the external body 1, film base 3, conductive layer 5, and protective layer 9 have been transparent to make the whole of the operation surface transparent, they do not necessarily have to be transparent depending on the provided product.

Sixth Modification

Although, in the first embodiment, a preferable structure has been formed by providing one conductive layer 5 so that a change in capacitance is detected with an electrode formed by the one layer to detect the position of the fingertip F10 of the user, this form is not a limitation. For example, as in the conventional examples, a coordinate input device may be formed that can detect coordinates by detecting a change in capacitance with electrodes in two layers, a first conductive layer in the X direction and a second conductive layer in the Y direction. Alternatively, a switch device, for example, may be formed that can detect the fingertip F10 of the user by using one conductive layer.

The present invention is not limited to the embodiment described above. The present invention can be appropriately modified without departing from the intended scope of the present invention.

What is claimed is:

1. A capacitive input device having a curved surface shape, the capacitive input device comprising:
   an external body molded with a synthetic resin, the external body having an external curved surface facing a user;
   a film base, which is integrally provided so as to conform to an internal curved surface of the external body;
   an adhesive layer provided between the internal curved surface of the external body and the film base;
   a conductive layer made of a conductive macromolecule, the conductive layer being disposed on an opposite surface of the film base, the opposite surface being opposite to a surface of the film base on the external body side;
   a wiring layer that is disposed to overlap a part of the conductive layer and is electrically connected to the conductive layer; and
   a protective layer that is disposed to cover an opposite surface of the conductive layer and is made of a material that comprises an insulative synthetic resin, the protective layer being thinner than the film base, the opposite surface of the conductive layer being opposite to a surface that is on the film base.

2. The capacitive input device according to claim 1, wherein the conductive macromolecule comprises a mixture of poly (3, 4-ethylenedioxythiophene) (PEDOT) and polystyrene sulfonate (PSS).

3. The capacitive input device according to claim 1, wherein the external body, the film base, and the conductive layer are transparent, and wherein a decorative layer is provided on a surface of the film base toward the external body.

* * * * *